(12) United States Patent
Hanawa et al.

(10) Patent No.: US 11,180,407 B2
(45) Date of Patent: Nov. 23, 2021

(54) GLASS SUBSTRATE, LAMINATED SUBSTRATE, AND LAMINATE

(71) Applicant: AGC Inc., Chiyoda-ku (JP)

(72) Inventors: Yu Hanawa, Tokyo (JP); Kazutaka Ono, Tokyo (JP); Shigeki Sawamura, Tokyo (JP)

(73) Assignee: AGC Inc., Chiyoda-ku (JP)

(*) Notice: Subject to any disclaimer, the term of this patent is extended or adjusted under 35 U.S.C. 154(b) by 90 days.

(21) Appl. No.: 15/939,631

(22) Filed: Mar. 29, 2018

(65) Prior Publication Data

US 2018/0222787 A1 Aug. 9, 2018

Related U.S. Application Data

(63) Continuation of application No. PCT/JP2016/078598, filed on Sep. 28, 2016.

(30) Foreign Application Priority Data

Oct. 2, 2015 (JP) .............................. JP2015-196548

(51) Int. Cl.
*C03C 3/087* (2006.01)
*B32B 17/06* (2006.01)
(Continued)

(52) U.S. Cl.
CPC ................ *C03C 3/087* (2013.01); *B32B 7/06* (2013.01); *B32B 17/06* (2013.01);
(Continued)

(58) Field of Classification Search
CPC ...... C03C 3/087; B32B 17/06; B32B 2457/14; H01L 23/15
See application file for complete search history.

(56) References Cited

U.S. PATENT DOCUMENTS 5,448,133 A * 9/1995 Ise .................... H01J 31/127
313/308
5,459,109 A * 10/1995 Lapp .................. C03C 3/091
501/66
(Continued)

FOREIGN PATENT DOCUMENTS

JP 03-170343 7/1991
JP 08-333133 12/1996
(Continued)

OTHER PUBLICATIONS

Machine translation of detailed description JP2003-112942 acquired on Jan. 9, 2020.*
(Continued)

*Primary Examiner* — Gerard Higgins
(74) *Attorney, Agent, or Firm* — Oblon, McClelland, Maier & Neustadt, L.L.P.

(57) ABSTRACT

A glass substrate contains, as a glass matrix composition as represented by mole percentage based on oxides, $SiO_2$: 58-75%, $Al_2O_3$: 4.5-16%, $B_2O_3$: 0-6%, MgO: 0-6%, CaO: 0-6%, SrO: 5-20%, BaO: 5-20%, and MgO+CaO+SrO+BaO: 15-40%. The glass substrate has an alkali metal oxide content of 0-0.1% as represented by mole percentage based on oxides. The glass substrate has an average coefficient of thermal expansion α of 56-90 ($\times 10^{-7}$/° C.) at 50° C.-350° C.

17 Claims, 3 Drawing Sheets

(51) Int. Cl.
- *B32B 7/06* (2019.01)
- *H01L 21/683* (2006.01)
- *H01L 21/78* (2006.01)
- *C03C 3/091* (2006.01)

(52) U.S. Cl.
CPC ...... *H01L 21/6835* (2013.01); *H01L 21/7813* (2013.01); *B32B 2250/02* (2013.01); *B32B 2250/03* (2013.01); *B32B 2457/14* (2013.01); *C03C 3/091* (2013.01); *H01L 2221/68318* (2013.01)

(56) References Cited

U.S. PATENT DOCUMENTS

| | | | | |
|---|---|---|---|---|
| 5,634,585 | A * | 6/1997 | Stansbury | H01J 9/185 156/64 |
| 5,741,746 | A | 4/1998 | Kohli et al. | |
| 6,012,192 | A * | 1/2000 | Sawada | H01L 21/67046 134/153 |
| 7,821,191 | B2 * | 10/2010 | Takahashi | H01J 29/085 313/496 |
| 2004/0145834 | A1 | 7/2004 | Miyano et al. | |
| 2004/0150297 | A1 | 8/2004 | Miyano et al. | |
| 2013/0082588 | A1 * | 4/2013 | Liu | H01J 3/021 313/496 |

FOREIGN PATENT DOCUMENTS

| | | |
|---|---|---|
| JP | 10-506088 | 6/1998 |
| JP | 2003-026442 | 1/2003 |
| JP | 2003-054985 | 2/2003 |
| JP | 2003-112942 | 4/2003 |
| JP | 2004-193574 | 7/2004 |
| JP | 2009-231635 A | 10/2009 |
| JP | 2010-218942 | 9/2010 |
| JP | 2012-60185 A | 3/2012 |
| JP | 2012-64710 A | 3/2012 |
| JP | 2014-40575 A | 3/2014 |
| JP | 2014-088306 | 5/2014 |
| JP | 2015-078113 | 4/2015 |
| WO | WO 2015/037478 A1 | 3/2015 |

OTHER PUBLICATIONS

Machine translation of detailed description JP2010-218942 acquired on Jan. 9, 2020.*

International Search Report dated Dec. 20, 2016 in PCT/JP2016/078598 filed Sep. 28, 2016 (with English Translation).

Written Opinion dated Dec. 20, 2016 in PCT/JP2016/078598 filed Sep. 28, 2016.

* cited by examiner

GLASS SUBSTRATE, LAMINATED SUBSTRATE, AND LAMINATE

TECHNICAL FIELD

The present invention relates to a glass substrate, a laminated substrate and a laminate.

BACKGROUND ART

In the field of semiconductor devices, while the degree of integration in devices increases, size reduction in the devices is proceeding. This has resulted in a growing desire for a technique for packaging a device having a high degree of integration.

A wafer-level packaging technique in which silicon substrates are stuck to a full-scale wafer-state glass substrate is attracting attention in recent years. Examples of such glass substrates to be used in the wafer-level packaging include supporting glass substrates for fan-out type wafer-level packaging (see, for example, Patent Document 1). In the fan-out type wafer-level packaging, a glass substrate is stuck to silicon substrates through a release layer such as a resin, and the silicon substrates are embedded in a resin. The glass substrate and the silicon substrates embedded in the resin are separated from each other by irradiation with ultraviolet light. The separated glass substrate is reused.

PRIOR ART DOCUMENTS

Patent Documents

Patent Document 1: JP-A-2015-78113
Patent Document 2: JPH-A-8-333133

SUMMARY OF THE INVENTION

Problem that the Invention is to Solve

Sticking a glass substrate with a silicon substrate necessitates a heat treatment step. In the heat treatment step, the glass substrate is stuck with the silicon substrate, with a release layer interposed therebetween, at a temperature of, for example, 200° C.-400° C., to form a laminated substrate, followed by being cooled gradually to room temperature. At this time, if there is a large difference in coefficient of thermal expansion between the glass substrate and the silicon substrate, a large residual strain (residual deformation) occurs in the glass substrate and silicon substrate due to the difference of coefficient of thermal expansion, rendering the laminated substrate prone to be deformed or damaged.

When the silicon substrate contains alkali ions, upon applying gate voltage to the semiconductor device, the alkali ions change an electric filed distribution, which makes switching function hard to work. Hence it is required not to allow alkali ions from diffusing from the glass substrate into the silicon substrate in the heat treatment step.

Since any stains or foreign matters on surfaces makes it difficult to stick a glass substrate to a silicon substrate, it is preferred to stick a glass substrate to a silicon substrate after washing with an acidic solution such as HCl or HF. Meanwhile, in fan-out type wafer-level packaging, to reuse a separated glass substrate, a release layer adherent to the glass substrate is removed by an acidic solution such as HCl or HF. A glass substrate is hence required to have chemical resistance to an acidic solution such as HCl or HF.

Patent Document 1 discloses a supporting glass substrate having an average coefficient of linear thermal expansion of $50 \times 10^{-7}$ to $66 \times 10^{-7}/°$ C. in a temperature range of 20-200° C. However, since the supporting glass substrate contains an alkali metal oxide, such as $Na_2O$ and $K_2O$ in an amount of 5% by mass or more, the diffusion of alkali ions to the semiconductor substrate is prone to occur in a heat treatment step.

Patent Document 2 discloses a glass having a coefficient of linear thermal expansion of 60 to $90 \times 10^{-7}/°$ C. in a temperature range of 0-300° C. However, this glass has insufficient chemical resistance to an acidic solution.

There has been no glass substrate, laminated substrate or laminate which satisfies all the following three requirements: (1) to have satisfactory chemical resistance to an acidic solution; (2) diffusion of alkali ions into a silicon substrate is less apt to occur in a heat treatment step for sticking a glass substrate with the silicon substrate; and (3) A residual strain that occurs to a laminated substrate in a heat treatment step is small.

The present invention provides a glass substrate, a laminated substrate and a laminate which satisfy all the three requirements described above.

Means for Solving the Problems

The glass substrate of the present invention contains, as a glass matrix composition as represented by mole percentage based on oxides,
 $SiO_2$: 58-75%,
 $Al_2O_3$: 4.5-16%,
 $B_2O_3$: 0-6%,
 MgO: 0-6%,
 CaO: 0-6%,
 SrO: 5-20%,
 BaO: 5-20%, and
 MgO+CaO+SrO+BaO: 15-40%,
has an alkali metal oxide content of 0-0.1% as represented by mole percentage based on oxides, and
has an average coefficient of thermal expansion α of 56-90 ($\times 10^{-7}/°$ C.) at 50° C.-350° C.

A laminated substrate of the present invention is formed by laminating the above described glass substrate and a silicon substrate.

A laminate of the present invention is formed by sticking another glass substrate to the glass substrate which is a component of the above described laminated substrate.

Advantageous Effect of the Invention

A glass substrate according to one embodiment of the present invention has satisfactory chemical resistance to an acidic solution. Also, alkali ions is less apt to diffuse into a silicon substrate in a heat treatment step for sticking the glass substrate with the silicon substrate. Furthermore, a residual strain that occurs to a laminated substrate is small.

BRIEF DESCRIPTION OF DRAWINGS

FIG. 1A is a cross-sectional view before the sticking, and FIG. 1B is a cross-sectional view after the sticking.

MODE FOR CARRYING OUT THE INVENTION

One embodiment of the present invention is explained below in detail by reference to drawings.

In the present description, each "-" used for indicating a numerical range means that the numerical values that precede and succeed the symbol are included in the range as the lower limit and the upper limit. Unless otherwise indicated, such "-" has the same meaning hereinafter.

A glass substrate according to one embodiment of the present invention is explained first.

Figure 1A:
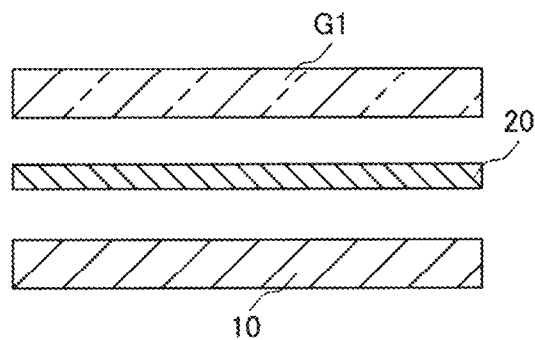
FIG. 1A and FIG. 1B illustrate a glass substrate according to one embodiment of the present invention to be stuck with a silicon substrate.
Figure 1B:
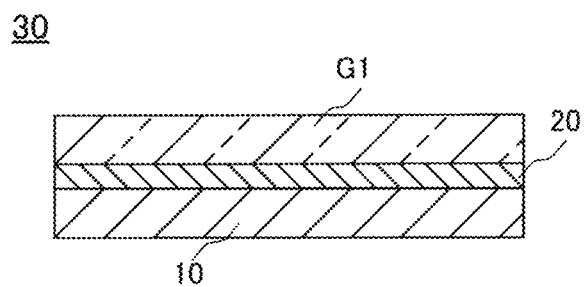

FIG. 1A and FIG. 1B are cross-sectional views of the glass substrate according to one embodiment of the present invention to be stuck with a silicon substrate. A glass substrate G1 according to one embodiment of the present invention illustrated in FIG. 1A, is stuck with a silicon substrate 10, with a release layer 20 interposed therebetween, at a temperature of, for example, 200-400° C., to obtain a laminated substrate 30 illustrated in FIG. 1B. As the silicon substrate 10, for example, a full-size silicon wafer or a silicon chip is used. The release layer 20 is, for example, a resin capable of withstanding at a temperature of 200° C.-400° C.

The glass substrate according to one embodiment of the present invention is used in sticking with the silicon substrate. For example, the glass substrate is usable as a supporting glass substrate for fan-out type wafer-level packaging, a glass substrate for image sensors, such as MEMS, CMOS and CIS, where element size reduction by wafer-level packaging is effective, a glass substrate having through-holes (glass interposer; GIP), and a support glass for semiconductor back grinding. The glass substrate is especially suitable as the supporting glass substrate for fan-out type wafer-level packaging.

Figure 2:
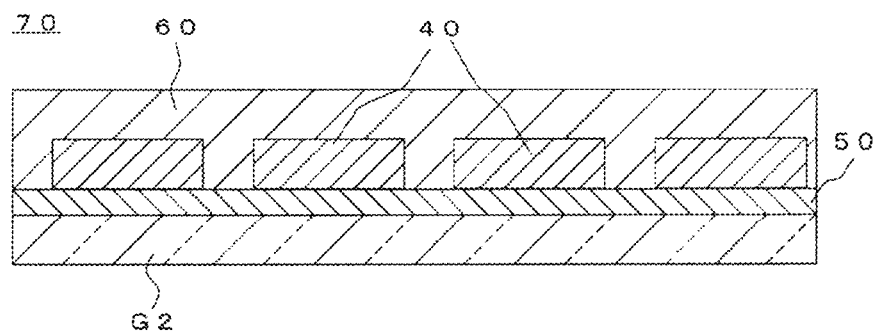
FIG. 2 is a cross-sectional view of a laminated substrate according to one embodiment of the present invention.

FIG. 2 is a cross-sectional view of a laminated substrate according to one embodiment of the present invention, in which the glass substrate according to one embodiment of the present invention is used as the supporting glass substrate for fan-out type wafer-level packaging.

In fan-out type wafer-level packaging, a laminated substrate 70 may be obtained by laminating a glass substrate G2 with silicon substrates 40 (e.g., silicon chip) through a release layer 50, such as a resin, at a temperature of, for example, 200° C.-400° C. and then embedding the silicon substrates 40 in a resin 60. Thereafter, the release layer 50 is irradiated with ultraviolet light through the glass substrate G2 to separate the glass substrate G2 from the silicon substrates 40 embedded in the resin 60. The separated glass substrate G2 is reused. The silicon substrates 40 embedded in the resin 60 are subjected to wiring with copper wire or the like. The glass substrate according to one embodiment of the preset invention has high chemical resistance to an acidic solution as will be described later, and is hence suitable for the supporting glass substrate for fan-out type wafer-level packaging which is reused.

The glass substrate according to one embodiment of the present invention contains, as a glass matrix composition, as represented by mole percentage based on oxides, $SiO_2$: 58-75%,
$Al_2O_3$: 4.5-16%,
$B_2O_3$: 0-6%,
MgO: 0-6%,
CaO: 0-6%,
SrO: 5-20%,
BaO: 5-20%, and
MgP+CaO+SrO+BaO: 15-40%.

$SiO_2$ is a component which forms a network of glass. In the case where the content of $SiO_2$ is 58% or more, a resistance to an acidic solution such as HCl or HF and to an alkaline solution such as NaOH increases. In addition, heat resistance and weatherability become satisfactory. The content of $SiO_2$ is preferably 60% or more, more preferably 64% or more. Meanwhile, in the case where the content of $SiO_2$ is 75% or less, the viscosity does not become excessively high at the melting of the glass and meltability becomes satisfactory. The satisfactory meltability enables the glass to be melted at low temperature, which reduces the amount of the fuel to be used and renders the melting furnace less apt to be damaged. The content of $SiO_2$ is preferably 70% or less, more preferably 68% or less.

In the case where the content of $Al_2O_3$ is 4.5% or more, a resistance to an acidic solution such as HCl or HF and to an alkaline solution such as NaOH increases. In addition, heat resistance and weatherability become satisfactory and Young's modulus become high. The content of $Al_2O_3$ is preferably 5.0% or more, more preferably 5.5% or more, even more preferably 5.8% or more. Meanwhile, in the case where the content of $Al_2O_3$ is 16% or less, the viscosity does not become excessively high at the melting of the glass and meltability becomes satisfactory. In addition, it is possible to lower a devitrification temperature, which cause a stable forming. The content of $Al_2O_3$ is preferably 10% or less, more preferably 8% or less, even more preferably 7% or less.

$B_2O_3$ is not an essential component. However, in the case where $B_2O_3$ is contained, the viscosity does not become excessively high at the melting of the glass and meltability becomes satisfactory. In addition, it is possible to lower a devitrification temperature, which causes a stable forming. Furthermore, since the Young's modulus becomes high, it is possible to suppress a warp or crack of the glass substrate which occurs during the slow cooling step of the glass production which will be described later. The content of $B_2O_3$ is preferably 1% or more, more preferably 2% or more. Meanwhile, in the case where the content of $B_2O_3$ is 6% or less, a glass transition temperature Tg can be increased. The content of $B_2O_3$ is preferably 5% or less, more preferably 4% or less, even more preferably 3% or less.

MgO is not an essential component. However, in the case where MgO is contained, the viscosity does not become excessively high at the melting of the glass and meltability becomes satisfactory. In addition, weatherability is improved and Young's modulus becomes high. The content of MgO is preferably 1% or more, more preferably 2% or more. Meanwhile, in the case where the content of MgO is 6% or less, devitrification is hard to occur. The content of MgO is preferably 5% or less, more preferably 4% or less, even more preferably 3% or less.

CaO is not an essential component. However, in the case where CaO is contained, the viscosity does not become excessively high at the melting of the glass and meltability becomes satisfactory. In addition, weatherability is improved. The content of CaO is preferably 1% or more, more preferably 2% or more. Meanwhile, in the case where the content of CaO is 6% or less, it is possible to lower a devitrification temperature, which causes a stable forming. In addition, chemical resistance to an acidic solution such as HCl or HF and to an alkaline solution such as NaOH becomes high. The content of CaO is preferably 5.5% or less, more preferably 5% or less, even more preferably 4.5% or less, especially preferably 4% or less.

In the case where the content of SrO is 5% or more, the viscosity does not become excessively high at the melting of the glass and meltability becomes satisfactory. In addition, weatherability is improved. Also the coefficient of thermal expansion can be heighten. The content of SrO is preferably 6% or more, more preferably 7% or more, even more preferably 8% or more. Meanwhile, in the case where the content of SrO is 20% or less, it is possible to lower a devitrification temperature, which causes a stable forming. The content of SrO is preferably 17% or less, more preferably 14% or less, even more preferably 11% or less, especially preferably 10% or less.

In the case where the content of SrO is 5% or more, the viscosity does not become excessively high at the melting of the glass and meltability becomes satisfactory. In addition, weatherability is improved. Also the coefficient of thermal expansion can be heighten. The content of BaO is preferably 8% or more, preferably 9% or more, preferably 10% or more, more preferably 11% or more, even more preferably 12% or more, especially preferably 13% or more, most preferably 14% or more. Meanwhile, in the case where the content of BaO is 20% or less, it is possible to lower a devitrification temperature, which causes a stable forming. The content of BaO is preferably 18% or less, more preferably 16% or less, even more preferably 15% or less.

The glass substrate according to one embodiment of the present invention has the total content of MgO, CaO, SrO, and BaO being 15-40% as represented by mole percentage based on oxides. In the case where the total content of MgO, CaO, SrO, and BaO is 15% or more, the viscosity does not become excessively high at the melting of the glass and meltability becomes satisfactory. In addition, weatherability is improved. The total content of MgO, CaO, SrO, and BaO is preferably 20% or more, more preferably 23% or more, even more preferably 25% or more, especially preferably 27% or more. Meanwhile, in the case where the total content of MgO, CaO, SrO, and BaO is 40% or less, chemical resistance to an acidic solution such as HCl or HF and to an alkaline solution such as NaOH becomes high. In addition, it is possible to lower a devitrification temperature, which causes a stable forming. The total content of MgO, CaO, SrO, and BaO is preferably 36% or less, more preferably 32% or less, even more preferably 30% or less, especially preferably 29% or less.

The glass substrate according to one embodiment of the present invention has an alkali metal oxide being 0-0.1% as represented by mole percentage based on oxides. Examples of the alkali metal oxide include $Li_2O$, $Na_2O$, $K_2O$, etc. In the case where the content of alkali metal oxide is 0.1% or less as represented by mole percentage based on oxides, the diffusion of alkali ions into a silicon substrate is less apt to occur in a heat treatment step for sticking the silicon substrate with the glass substrate. The content of alkali metal oxide is more preferably 0.05% or less, even more preferably 0.02% or less, as represented by mole percentage based on oxides. It is especially preferable that the glass substrate should contain substantially no alkali metal oxide. The expression "containing substantially no alkali metal oxide" means that the glass substrate contains no alkali metal oxides at all or that the glass substrate may contain alkali metal oxide as impurities which have come thereinto unavoidably during the production.

The glass substrate according to one embodiment of the present invention has an average coefficient of thermal expansion $\alpha$ of 56-90 ($\times 10^{-7}/°$ C.) at 50° C.-350° C. In the case where the $\alpha$ is 56-90 ($\times 10^{-7}/°$ C.), it is easy to reduce the residual strain that occurs in the laminated substrate during a heat treatment step for sticking the glass substrate with a silicon substrate. Any influence of the release layer interposed between the glass substrate and the silicon substrate is negligible because the release layer is far thinner than the glass substrate and the silicon substrate.

In the case of use in fan-out type wafer-level packaging, the heat treatment step for sticking the glass substrate G2 with the silicon substrates 40 further involves embedding the silicon substrates 40 with the resin 60. In the case where the $\alpha$ is 56-90 ($\times 10^{-7}/°$ C.), it is easy to reduce the residual stress that occurs in the glass substrate G2, the silicon substrates 40 and the resin 60.

The $\alpha$ is preferably 60 ($\times 10^{-7}/°$ C.) or more, more preferably 62 ($\times 10^{-7}/°$ C.) or more, even more preferably 65 ($\times 10^{-7}/°$ C.) or more, especially preferably 67 ($\times 10^{-7}/°$ C.) or more. Meanwhile, the a is preferably 80 ($\times 10^{-7}/°$ C.) or less, more preferably 75 ($\times 10^{-7}/°$ C.) or less, even more preferably 72 ($\times 10^{-7}/°$ C.) or less, especially preferably 70 ($\times 10^{-7}/°$ C.) or less.

The average coefficient of thermal expansion $\alpha$ at 50° C.-350° C. is an average coefficient of thermal expansion measured by the method specified in MS R3102 (1995), over a temperature range for measurement of the coefficient of thermal expansion being 50° C.-350° C.

The glass substrate according to one embodiment of the present invention preferably has a value of 56-90, the value determined by the expression (1) shown below which represents the relationship between rates of each of the oxides as represented by mole percentage based on oxides.

$$0.174 \times (\text{content of } SiO_2) - 0.012 \times (\text{content of } Al_2O_3) + 0.317 \times (\text{content of } B_2O_3) + 0.988 \times (\text{content of } MgO) + 1.715 \times (\text{content of } CaO) + 2.011 \times (\text{content of } SrO) + 2.251 \times (\text{content of } BaO) + 0.076 \quad (1).$$

The expression (1) is a regression equation which represents a relationship between the glass composition and the average coefficient of thermal expansion at 50° C.-350° C. The regression equation was obtained by determining the average coefficient of thermal expansions at 50° C.-350° C. of about a hundred glasses differing in $SiO_2$ content, $Al_2O_3$ content, $B_2O_3$ content, MgO content, CaO content, SrO content, and BaO content. In the case where the value of expression (1) is 56-90, it is easy to adjust an average coefficient of thermal expansion within the range of 56-90 ($\times 10^{-7}/°$ C.) at 50° C.-350° C.

The value of expression (1) is preferably 60 or more, more preferably 62 or more, even more preferably 65 or more, especially preferably 67 or more. Meanwhile, in the case where the value of expression (1) is 90 or less, it is easy to reduce the residual stress that occurs in the silicon substrate during the heat treatment step. The value of expression (1) is preferably 80 or less, more preferably 75 or less, even more preferably 72 or less, especially preferably 70 or less.

The glass substrate according to one embodiment of the present invention preferably has a total content of $SiO_2$ and $Al_2O_3$ of 65% or more as represented by mole percentage based on oxides. In the case where it is 65% or more, chemical resistance to an acidic solution and an alkaline solution increases. The total content of $SiO_2$ and $Al_2O_3$ is more preferably 68% or more, even more preferably 70% or more, especially preferably 72% or more. Meanwhile, the total content of $SiO_2$ and $Al_2O_3$ is preferably 80% or less. In the case where it is 80% or less, the viscosity does not become excessively high at the melting of the glass and meltability becomes satisfactory. Also an average coefficient of thermal expansion does not become too low. The total content of $SiO_2$ and $Al_2O_3$ is more preferably 78% or less, even more preferably 76% or less, especially preferably 75% or less.

The glass substrate according to one embodiment of the present invention may contain $SnO_2$, $SO_3$, Cl, F, or the like. The inclusion of $SnO_2$, $SO_3$, Cl, and F can suppress bubbling during the glass substrate production, thereby yielding the glass substrate containing few bubbles.

The glass substrate according to one embodiment of the present invention may contain $ZrO_2$ in order to improve the weatherability. In the case of incorporating $ZrO_2$, the content thereof is preferably 2% or less, more preferably 1% or less, especially preferably 0.5% or less, as represented by mole percentage based on oxides.

The glass substrate according to one embodiment of the present invention may contain ZnO in order to regulate the viscosity or the average coefficient of thermal expansion. In the case of incorporating ZnO, the content thereof is preferably 2% or less, more preferably 1% or less, especially preferably 0.5% or less, as represented by mole percentage based on oxides.

The glass substrate according to one embodiment of the present invention may contain $Y_2O_3$, $La_2O_3$ and $TiO_2$ in order to improve the chemical resistance and Young's modulus of the glass. However, the total content thereof is preferably 2% or less, more preferably 1% or less, especially preferably 0.5% or less, as represented by mole percentage based on oxides.

The glass substrate according to one embodiment of the present invention may contain a reducing agent in order to heighten the ultraviolet transmittance. In the case of incorporating a reducing agent, the content of the each reducing agent is preferably 2% or less, more preferably 1% or less, especially preferably 0.5% or less, most preferably 0.2% or less, as represented by mole percentage based on oxides. Examples of the reducing agent include carbon and coke.

It is preferable that the glass substrate according to one embodiment of the present invention should contain substantially none of $V_2O_5$, $P_2O_5$, $CeO_2$, $Y_2O_3$, $La_2O_3$, and $TiO_2$, from the standpoints of striae, coloration and the like.

It is preferable that the glass substrate according to one embodiment of the present invention should contain substantially none of $As_2O_3$ and $Sb_2O_3$, from the standpoint of environmental burden. Also, to conduct float-process forming stably, it is preferable that the glass substrate should contain substantially no ZnO.

The glass substrate according to one embodiment of the present invention preferably has a weight loss per unit area of 0.3 $mg/cm^2$ or less, through 20-hour immersion in HCl solution having a temperature of 90° C. and a concentration of 0.1 N. In the case where the weight loss is 0.3 $mg/cm^2$ or less, the resistance to HCl solution is high. Thereby the glass substrate is less apt to thin when washed with HCl solution. In addition, the glass substrate is less apt to thin also at the time of washing the glass substrate removed from a laminated substrate with HCl solution, rendering the reuse thereof easy. The weight loss thereof is more preferably 0.2 $mg/cm^2$ or less, even more preferably 0.1 $mg/cm^2$ or less, especially preferably 0.05 $mg/cm^2$ or less, most preferably 0.03 $mg/cm^2$ or less.

The glass substrate according to one embodiment of the present invention preferably has a haze of 50% or less with a thickness of 1 mm, after 20-hour immersion in HCl solution having a temperature of 90° C. and a concentration of 0.1 N. The value of haze is measured in accordance with JIS K7136 (2000). In the case where the haze thereof is 50% or less, the resistance to HCl solution is high. Thereby the glass substrate is less apt to thin when washed with HCl solution. In addition, the glass substrate is less apt to thin also at the time of washing the glass substrate removed from a laminated substrate with HCl solution, rendering the reuse thereof easy. The haze thereof is preferably 30% or less, preferably 10% or less, more preferably 5% or less, even more preferably 2% or less, especially preferably 1% or less, most preferably 0.5% or less.

The glass substrate according to one embodiment of the present invention preferably has a weight loss per unit area of 13 $mg/cm^2$ or less, through 20-minute immersion in HF solution having a temperature of 25° C. and a concentration of 5%. In the case where the weight loss is 13 $mg/cm^2$ or less, the resistance to HF solution is high. Thereby the glass substrate is less apt to thin when washed with HF solution. In addition, the glass substrate is less apt to thin also at the time of washing the glass substrate removed from a laminated substrate with HF solution, rendering the reuse thereof easy. The weight loss thereof is more preferably 11 $mg/cm^2$ or less, even more preferably 9 $mg/cm^2$ or less, especially preferably 7 $mg/cm^2$ or less, most preferably 6 $mg/cm^2$ or less.

The glass substrate according to one embodiment of the present invention preferably has a haze of 50% or less after 20-minute immersion in HF solution having a temperature of 25° C. and a concentration of 5%. In the case where the haze thereof is 50% or less, the resistance to HF solution is high. Thereby the glass substrate is less apt to thin when washed with HF solution. In addition, the glass substrate is less apt to thin also at the time of washing the glass substrate removed from a laminated substrate with HF solution, rendering the reuse thereof easy. The haze thereof is more preferably 30% or less, even more preferably 10% or less, especially preferably 5% or less, most preferably 2% or less.

The glass substrate according to one embodiment of the present invention may be washed with a solution of an alkali such as NaOH, and then stuck with a silicon substrate. Washing with a solution of an alkali such as NaOH can remove any stains and foreign matters from the surfaces of the glass substrate.

The glass substrate according to one embodiment of the present invention preferably has a weight loss per unit area of 3 $mg/cm^2$ or less, through 20-hour immersion in NaOH solution having a temperature of 90° C. and a concentration of 0.1 N. In the case where the weight loss is 3 $mg/cm^2$ or less, the resistance to NaOH solution is high. Thereby the glass substrate is less apt to thin when washed with NaOH solution. In addition, the glass substrate is less apt to thin also at the time of washing the glass substrate removed from a laminated substrate with NaOH solution, rendering the reuse thereof easy. The weight loss thereof is more preferably 2.5 $mg/cm^2$ or less, even more preferably 2 $mg/cm^2$ or less, especially preferably 1.5 $mg/cm^2$ or less, most preferably 1 $mg/cm^2$ or less.

The glass substrate according to one embodiment of the present invention preferably has a haze of 50% or less after 20-hour immersion in NaOH solution having a temperature of 90° C. and a concentration of 0.1 N. In the case where the haze thereof is 50% or less, the resistance to NaOH solution is high. Thereby the glass substrate is less apt to thin when washed with NaOH solution. In addition, the glass substrate is less apt to thin also at the time of washing the glass substrate removed from a laminated substrate with NaOH solution, rendering the reuse thereof easy. The haze thereof is preferably 30% or less, more preferably 10% or less, even more preferably 5% or less, especially preferably 2% or less, most preferably 1% or less.

In the case where the glass substrate according to one embodiment of the present invention is used in fan-out type wafer-level packaging, the release layer between the glass substrate and the silicon substrates is irradiated with ultraviolet light through the glass substrate, thereby the glass substrate is removed from the laminated substrate.

The glass substrate according to one embodiment of the present invention preferably has a transmittance at 360 nm wavelength of 15% or more with a thickness of 1 mm. In the case where the transmittance of the glass substrate at 360 nm wavelength is 15% or more, the glass substrate can be easily removed from the laminated substrate by irradiation with ultraviolet light. The transmittance thereof at 360 nm wavelength is more preferably 20% or more, even more preferably 25% or more, especially preferably 30% or more.

The glass substrate according to one embodiment of the present invention preferably has a glass devitrification temperature of 1250° C. or less. In the case where the glass devitrification temperature thereof is 1250° C. or less, stable forming can be achieved. The glass devitrification temperature thereof is more preferably 1200° C. or less, even more preferably 1170° C. or less, especially preferably 1150° C. or less, most preferably 1100° C. or less. The devitrification temperature of a glass is determined by placing crushed particles of the glass on a platinum dish, heat-treating the particles for 17 hours in an electric furnace controlled so as to have a constant temperature, examining the heat-treated glass with an optical microscope to determine a highest temperature at which crystal precipitation does not occur in the glass surface and the inside thereof, and taking the highest temperature as the devitrification temperature.

The glass substrate according to one embodiment of the present invention preferably has a devitrification viscosity ($\eta_{TL}$) of $10^{3.8}$ dPa·s or more. In the case where the devitrification viscosity thereof is $10^{3.8}$ dPa·s or more, stable forming can be achieved. The devitrification viscosity thereof is more preferably $10^{4.0}$ dPa·s or more, even more preferably $10^{4.2}$ dPa·s or more.

The glass substrate according to one embodiment of the present invention preferably has $Fe_2O_3$ content of 200 ppm or less as represented by mass parts per million based on oxides, to make the glass substrate less apt to absorb visible light in the case of use as the cover glass of a CMOS sensor. The content of $Fe_2O_3$ is more preferably 150 ppm or less, even more preferably 100 ppm or less, especially preferably 50 ppm or less.

The glass substrate according to one embodiment of the present invention preferably has $Fe_2O_3$ content more than 200 ppm and 1,000 ppm or less, as represented by mass parts per million based on oxides, to increase thermal conductivity and achieve satisfactory meltability. In the case where the content of $Fe_2O_3$ exceeds 200 ppm, thermal conductivity of the glass substrate can be increased and satisfactory meltability can be achieved. In the case where the content of $Fe_2O_3$ is 1,000 ppm or less, the glass substrate is less apt to absorb visible light and hard to be colored. The content of $Fe_2O_3$ is more preferably 300-800 ppm, even more preferably 400-700 ppm, especially preferably 500-600 ppm.

The glass substrate according to one embodiment of the present invention preferably has proportion by mass (%) of divalent iron in terms of $Fe_2O_3$ in the total iron in terms of $Fe_2O_3$ (hereinafter, the proportion is referred to as Fe-Redox) is 20% or more. In the case where the Fe-Redox is 20% or more, transmittance of the glass substrate at wavelengths of 400 nm or less can be increased, which allows a more amount of ultraviolet light to strike on the release layer such as a resin, to enable the glass substrate to be easily removed from the laminated substrate. The Fe-redox is more preferably 25% or more, even more preferably 30% or more, especially preferably 40% or more.

The glass substrate according to one embodiment of the present invention preferably has a Young's modulus of 65 GPa or more. The value of Young's modulus is determined by an ultrasonic pulse method. In the case where the Young's modulus thereof is 65 GPa or more, it is possible to suppress a warp or crack of the glass substrate which occurs during the slow cooling step of the glass production which will be described later. In addition, a damage caused by contact with a silicon substrate when stuck with the silicon substrate or by contact with a peripheral member when the glass substrate is conveyed can be suppressed. The value of Young's modulus is determined by an ultrasonic method. The Young's modulus thereof is more preferably 70 GPa or more, even more preferably 75 GPa or more, especially preferably 80 GPa or more. The Young's modulus thereof is preferably 100 GPa or less. In the case where the Young's modulus thereof is 100 GPs or less, the glass is inhibited from being brittle, and the glass substrate can be inhibited from chipping during cutting. The Young's modulus thereof is more preferably 90 GPa or less, even more preferably 87 GPa or less.

The glass substrate according to one embodiment of the present invention preferably has a thickness of 2.0 mm or less. In the case where the thickness thereof is 2.0 mm or less, size of a laminated substrate obtained by sticking the glass substrate with a silicon substrate can a reduced. The thickness thereof is more preferably 1.5 mm or less, even more preferably 1.0 mm or less, especially preferably 0.8 mm or less. The thickness thereof is preferably 0.1 mm or more. In the case where the thickness thereof is 0.1 mm or more, a damage caused by contact with a silicon substrate when stuck with the silicon substrate or by contact with a peripheral member when the glass substrate is conveyed can be suppressed. In addition, deflection of the glass substrate by its own weight can be suppressed. The thickness thereof is more preferably 0.2 mm or more, even more preferably 0.3 mm or more.

The glass substrate according to one embodiment of the present invention preferably has at least one main surface area of 70-2,500 $cm^2$. In the case where the area of the glass substrate is 70 $cm^2$ or more, a large number of silicon substrates (e.g., silicon chip) can be disposed thereon, resulting in an improvement in production efficiency in the step of laminating the glass substrate with silicon substrates. The area thereof is more preferably 80 $cm^2$ or more, even more preferably 170 $cm^2$ or more, especially preferably 300 $cm^2$ or more, most preferably 700 $cm^2$ or more. In the case where the area thereof is 2,500 $cm^2$ or less, the glass substrate is easy to handle and a damage caused by contact with a silicon substrate when stuck with the silicon substrate or by contact with a peripheral member when the glass substrate is conveyed can be suppressed. The area thereof is more preferably 2,100 $cm^2$ or less, even more preferably 1,700 $cm^2$ or less, especially preferably 800 $cm^2$ or less, most preferably 750 $cm^2$ or less.

The glass substrate according to one embodiment of the present invention preferably has a density of 3.50 $g/cm^3$ or less. In the case where the density thereof is 3.50 $g/cm^3$ or less, the glass substrate is lightweight and easy to handle. In addition, deflection of the glass substrate by its own weight can be suppressed. The density thereof is more preferably 3.40 $g/cm^3$ or less, even more preferably 3.30 $g/cm^3$ or less. The density thereof is preferably 2.50 $g/cm^3$ or more. In the case where the density thereof is 2.50 $g/cm^3$ or more, the glass substrate can have a heightened Vickers hardness, rendering the glass surface less apt to receive scratches. The density thereof is more preferably 2.60 g/cm$^3$ or more, even more preferably 2.70 g/cm$^3$ or more, especially preferably 2.80 g/cm$^3$ or more.

The glass substrate according to one embodiment of the present invention preferably has main surfaces having a circular shape. In the case where the main surfaces thereof are circular, the glass substrate can be easily stuck with a circular silicon substrate. The term "circular" means a shape that is not limited to a complete circle and that may be a circle in which the dimensional deviations from a complete circle having the same diameter are 50 μm or less.

The glass substrate according to one embodiment of the present invention may have main surfaces having a rectangular shape, not limited to a circle. The glass substrate may have a notch or orientation flat formed in the edge of the glass substrate. In the case of a circular shape, a part of the periphery may be straight.

The glass substrate according to one embodiment of the present invention, in the case of circular, preferably has a diameter of 7 cm or more. In the case where the diameter thereof is 7 cm or more, many semiconductor elements can be obtained from a laminated substrate formed by sticking the glass substrate with silicon substrates, resulting in an improvement in production efficiency. The diameter thereof is more preferably 10 cm or more, even more preferably 15 cm or more, especially preferably 20 cm or more, most preferably 25 cm or more. The diameter thereof is preferably 50 cm or less. In the case where the diameter thereof is 50 cm or less, the glass substrate is easy to handle. The diameter thereof is more preferably 45 cm or less, even more preferably 40 cm or less, especially preferably 35 cm or less.

The glass substrate according to one embodiment of the present invention preferably has β-OH of 0.05-0.65 mm$^{-1}$. β-OH is an index of the water content of the glass substrate according to one embodiment of the present invention. By regulating the β-OH to 0.05 mm$^{-1}$ or more, bubbling can be inhibited during production, thereby yielding a glass substrate containing few bubbles. The β-OH thereof is more preferably 0.1 mm$^{-1}$ or more, even more preferably 0.15 mm$^{-1}$ or more, especially preferably 0.17 mm$^{-1}$ or more. Meanwhile, by regulating the β-OH to 0.65 mm$^{-1}$ or less, the heat resistance can be enhanced. The β-OH thereof is more preferably 0.55 mm$^{-1}$ or less, even more preferably 0.5 mm$^{-1}$ or less, especially preferably 0.45 mm$^{-1}$ or less. The values of β-OH were determined by the following equation.

$$\beta\text{-OH}(\text{mm}^{-1}) = -\log_{10}(T_{3500}\text{ cm}^{-1}/T_{4000}\text{ cm}^{-1})/t$$

In the equation, $T_{3500}$ cm$^{-1}$ is the transmittance (%) of light having a wave number of 3,500 cm$^{-1}$, $T_{4000}$ cm$^{-1}$ is the transmittance (%) of light having a wave number of 4,000 cm$^{-1}$, and t is the thickness (mm) of the glass substrate.

The glass substrate according to one embodiment of the present invention preferably has a light-shielding film disposed on at least one main surface thereof. In the case where the glass substrate has a light-shielding film formed on the main surface thereof, it is easy to detect the position of the glass substrate or laminated substrate in the step of inspecting the glass substrate or laminated substrate. The position thereof is specified on the bases of reflected light caused by irradiating the glass substrate or laminated substrate with light. Glass substrates are prone to transmit light. By forming a light-shielding film on a main surface of the glass substrate, the reflected light is intensified to facilitate the detection of the position. The light-shielding film preferably contains Ti.

The glass substrate according to one embodiment of the present invention preferably has a strain point of 620° C. or more. In the case where the strain point thereof is 620° C. or more, the glass substrate can be inhibited from dimensionally changing in a heat treatment step. The strain point thereof is more preferably 650° C. or more, even more preferably 670° C. or more, especially preferably 690° C. or more.

The glass substrate according to one embodiment of the present invention preferably has a glass transition temperature (Tg) of 680° C. or more. In the case where the glass transition temperature (Tg) thereof is 680° C. or more, the glass substrate can be inhibited from dimensionally changing in a heat treatment step. The glass transition temperature (Tg) thereof is more preferably 700° C. or more, even more preferably 720° C. or more, especially preferably 730° C. or more.

The glass substrate according to one embodiment of the present invention preferably has a temperature ($T_2$) of 1670° C. or lower at which a viscosity is 10$^2$ dPa·s. In the case where the $T_2$ is 1670° C. or lower, this glass shows satisfactory meltability. The $T_2$ is more preferably 1600° C. or lower, more preferably 1550° C. or lower, especially preferably 1500° C. or lower.

The glass substrate according to one embodiment of the present invention preferably has a temperature ($T_4$) of 1270° C. or lower at which a viscosity is 10$^4$ dPa·s. In the case where the $T_4$ is 1270° C. or lower, the glass shows satisfactory meltability. The $T_4$ is more preferably 1230° C. or lower, even more preferably 1200° C. or lower, especially preferably 1150° C. or lower, most preferably 1100° C. or lower. In terms of facility to ensure other properties, the temperature ($T_4$) at which the viscosity is 10$^4$ dPa·s is 1050° C. or more.

The glass substrate according to one embodiment of the present invention preferably has the difference ($T_4$-$T_L$) between the temperature ($T_4$) at which the viscosity is 10$^4$ dPa·s and the glass devitrification temperature ($T_L$) being −20° C. or more. In the case where ($T_4$-$T_L$) is −20° C. or more, the glass can be stably formed. ($T_4$-$T_L$) is more preferably 0° C. or more, even more preferably 10° C. or more, especially preferably 20° C. or more, most preferably 30° C. or more.

A laminated substrate according to one embodiment of the present invention is explained next.

The laminated substrate according to one embodiment of the present invention includes the glass substrate described above and a silicon substrate laminated thereto. The laminated substrate thus configured has high chemical resistance to acidic solution. Furthermore, in a heat treatment step for sticking the silicon substrate with the glass substrate, diffusion of alkali ions into the silicon substrate is less apt to occur, and a residual strain that occurs to the laminated substrate is small.

A laminate according to one embodiment of the present invention is explained next.

The laminate according to one embodiment of the present invention includes the above described laminated substrate and another glass substrate stuck to the glass substrate which is a component of the laminated substrate. In the case where the laminated substrate according to one embodiment of the present invention is to be used, for example, as a support glass for semiconductor back grinding, the glass substrate is ground after sticking the glass substrate to the silicon substrate, in order to reduce the thickness of the laminated substrate.

The laminate according to one embodiment of the present invention is formed by sticking a glass substrate to the glass substrate which is a component of the laminated substrate. Thereby the thickness of the laminate can be reduced by removing the former glass substrate in place of grinding the latter glass substrate. For example, as compared with a laminated substrate including a glass substrate having any thickness, a laminate including two glass substrates each having a half thickness of said glass substrate has an advantage in that the thickness thereof can be made smaller than the thickness of the laminated substrate, without grinding, by removing one of the glass substrates. Meanwhile, a laminated substrate including a glass substrate having any thickness has a deflection amount larger than the deflection amount of a laminate obtained by laminating two glass substrates each having a half thickness of said glass substrate. Forming a laminate by laminating a desired number of glass substrates each having a desired thickness can reduce a deflection amount of the laminate.

A process for producing the glass substrate according to one embodiment of the present invention is explained next.

The glass substrate according to one embodiment of the present invention is produced through the steps of melting, refining, forming, slow cooling, and cutting.

In the melting step, raw materials are prepared so as to result in a desired glass composition, and the raw materials are introduced into a melting furnace and heated to preferably about 1450 to 1650° C. to obtain a molten glass.

As the raw materials, oxide, carbonate, nitrate, and hydroxide may be used. In some cases, other materials including halide such as chloride is also usable. In the case where the process includes a step in which the molten glass comes into contact with platinum such as in the melting step or refining step, fine platinum particles may come into the molten glass and be included as foreign matter in the glass substrate obtained. Nitrate has the effect of preventing the inclusion of platinum as foreign matter and, hence, use thereof as raw materials is preferred. Nitrate such as strontium nitrate, barium nitrate, magnesium nitrate, calcium nitrate, and the like can be used. More preferred is to use strontium nitrate. With respect to the particle size of the raw materials, use may be suitably made of raw materials ranging from such a large particle diameter of several hundred micrometers that the particles do not remain unmelted, to such a small particle diameter of several micrometers that the particles neither fly off during raw-material conveyance nor aggregate into secondary particles. Granules is also usable. Melting conditions including water content, β-OH and degree of oxidation-reduction of Fe or Redox [$Fe^{2+}/(Fe^{2+}+Fe^{3+})$] can be suitably regulated.

In the refining step, $SO_3$ or $SnO_2$ can be used as a refining agent for the glass substrate according to the present invention. A method of degassing under reduced pressure may be applied. Preferred $SO_3$ source is the sulfate of at least one element selected from Al, Mg, Ca, Sr, and Ba. More preferred is the sulfate of alkaline earth metal. Especially preferred of these are $CaSO_4.2H_2O$, $SrSO_4$, and $BaSO_4$, which are highly effective in enlarging bubbles. As a refining agent for the method of degassing performed under reduced pressure, it is preferred to use a halogen such as Cl or F. Preferred Cl source is the chloride of at least one element selected from among Al, Mg, Ca, Sr, and Ba. More preferred is the chloride of alkaline earth metal. Especially preferred of these are $SrCl_2.6H_2O$ and $BaCl_2.2H_2O$, which are highly effective in enlarging bubbles and have low deliquescence. Preferred F source is the fluoride of at least one element selected from among Al, Mg, Ca, Sr, and Ba. More preferred is the fluoride of alkaline earth metal. Especially preferred of these is $CaF_2$, which is highly effective in enhancing the meltability of raw glass materials.

In the forming step, the float process is used in which the molten glass is poured onto a molten metal to obtain a plate-shaped glass ribbon.

In the slow cooling step, the glass ribbon is annealed.

In the cutting step, the glass ribbon after the slow cooling is cut into a given size to obtain a glass substrate.

The present invention is not limited to the embodiments described above. Modifications, improvements, and the like made within a range where the object of the invention can be achieved are included in the invention.

For example, in the case of producing a glass substrate according to one embodiment of the present invention, the fusion method, press molding method or the like may be used in the forming step to form the molten glass into a plate shape.

A platinum crucible may be used in producing a glass substrate according to one embodiment of the present invention. In the case of using a platinum crucible, in the melting step, raw materials are prepared so as to result in the composition of the glass substrate to be obtained, and the platinum crucible containing the raw materials is introduced into an electric furnace. Then the raw materials are heated to preferably about 1450-1650° C. followed by being inserted with a platinum stirrer to be stirred for 1-3 hours, thereby obtaining a molten glass.

The glass substrate obtained by the cutting may be heated, for example, to a temperature more by about 50° C. than the glass transition temperature Tg and then gradually cooled to a room-temperature state. Thus, the residual strain in the glass substrate can be removed.

The glass substrate according to one embodiment of the present invention may be used as a glass substrate having through-hole (glass interposer; GIP). In a through glass via (TGV) technique employing a GIP, a silicon substrate is laminated to one side of the main surfaces of the GIP at a temperature of, for example 200-400° C., and a wiring substrate configured by forming wiring on a polyimide resin with copper or the like is laminated to the other main surface of the GIP. Then, the silicon substrate and the wiring substrate are connected to each other with copper wire or the like through the through-hole of the glass substrate.

The glass substrate according to one embodiment of the present invention, when used as a GIP, can reduce the residual strain which occurs in the glass substrate, silicon substrate, wiring substrate, and wiring in the heat treatment step, since an average coefficient of thermal expansion α at 50° C.-350° C. is 56-90 ($\times 10^{-7}$/° C.).

EXAMPLES

The present invention is explained below in more detail by reference to Examples, but the present invention is not limited to the following Examples.

Various raw glass materials including silica sand were prepared so as to result in each of the glass compositions shown in Table 1 and 2. In mass percentage based on oxide, a sulfate was added in an amount of 0.1-1% in terms of $SO_3$ and Cl was added in an amount of 0.1-1% to the raw materials having desired composition as 100%. By using a platinum crucible, each resultant mixture was melted by heating at a temperature of 1550-1650° C. for 3 hours. During the melting, a platinum stirrer was inserted for stirring for 1 hour to homogenize the glass. The molten glass was subsequently poured and formed into a plate shape.

Then the plate-shaped glass was introduced into an electric furnace having a temperature more by about 50° C. than the glass transition temperature Tg, and the temperature of the electric furnace was lowered at a cooling rate of 1° C./min until the glass was cooled to room temperature.

The obtained glass was examined for average coefficient of thermal expansion (unit: $10^{-7}$/° C.), density (unit: g/cm$^3$), Young's modulus (unit: GPa), strain point (unit: ° C.), glass transition temperature Tg (unit: ° C.), $T_4$ (unit: ° C.), $T_2$ (unit: ° C.), devitrification temperature (unit: ° C.), and chemical resistance. The value of expression (1) and $T_4$-$T_L$ were determined and shown in Table 1 and 2. In the tables, the values given in the parentheses were determined by calculations. The blanks in the tables indicate that no measurement had been made for determining the properties. The content of alkali metal oxide in each glass was 0.1% or less as represented by mole percentage based on oxides. The amount of residual $Fe_2O_3$ in each glass was 10-300 ppm, and the amount of residual $SO_3$ therein was 10-300 ppm. The methods used for determining the properties are shown below.

(Average Coefficient of Thermal Expansion)

A differential dilatometer (TMA) was used for measurement in accordance with the method specified in MS R3102 (1995). The measurement temperature range was 50-350° C. The coefficient was shown with the unit $10^{-7}$/° C.

(Density)

About 20 g of glass mass containing no bubble was examined by Archimedes' method.

(Young's Modulus)

Glass having a thickness of 0.5-10 mm was examined by an ultrasonic pulse method.

(Strain Point)

A measurement was made in accordance with the method specified in MS R3103-2 (2001).

(Glass Transition Temperature Tg)

A measurement was made by using a TMA in accordance with the method specified in MS R3103-3 (2001).

($T_4$)

A rotational viscometer was used to measure the viscosity to determine the temperature $T_4$ (° C.) at which the viscosity was $10^4$ dPa·s.

($T_2$)

A rotational viscometer was used to measure the viscosity to determine the temperature $T_2$ (° C.) at which the viscosity was $10^2$ dPa·s.

(Devitrification Temperature)

The devitrification temperature of a glass is determined by placing crushed particles of the glass on a platinum dish, heat-treating the particles for 17 hours in an electric furnace controlled so as to have a constant temperature, examining the heat-treated glass with an optical microscope to determine a highest temperature at which crystal precipitation does not occur in the glass surface and the inside thereof, and taking the highest temperature as the devitrification temperature.

(Chemical Resistance: Weight Loss, Haze, Appearance)

A glass obtained was mirror-polished by using a diamond grindstone, a cerium oxide grindstone and cerium oxide abrasive grains into a size of 40 mm×40 mm×1 mm. In order to examine the resistance to HCl, the mirror-polished glass was disposed on a fluororesin jig so that two orthogonal sides of the glass were supported thereby, and was immersed for 20 hours in 330 mL of HCl solution which had a temperature of 90° C. and a concentration of 0.1 N in a lidded vessel made of a fluororesin. The glass was taken out, and the surfaces thereof were rinsed with ion-exchanged water. The glass was subjected to 10-minute ultrasonic cleaning in ion-exchanged water and then left to dry on the jig. Thereafter, the glass was subjected to an appearance examination and weighed to determine the weight loss per unit area (unit: mg/cm$^2$) through the immersion. Furthermore, a hazeometer (tough panel type haze computer Type HZ-2, manufactured by Suga Test Instruments, Co., Ltd.) was used to measure the haze (unit: %) of the glass after the immersion in accordance with the method specified in JIS K7136 (2000).

In order to examine resistance to HF, the mirror-polished glass was disposed on a fluororesin jig so that two orthogonal sides of the glass were supported thereby, and was immersed for 20 minutes in 150 mL of HF solution which had a temperature of 25° C. and a concentration of 5% in a lidded vessel made of a fluororesin. The glass was taken out, and the surfaces thereof were rinsed with ion-exchanged water. The glass was subjected to 10-minute ultrasonic cleaning in ion-exchanged water and then left to dry on the jig. Thereafter, the glass was subjected to an appearance examination and measurements of the weight loss per unit area (unit: mg/cm$^2$) through the immersion and the haze (unit: %).

Furthermore, in order to examine the resistance to NaOH, the mirror-polished glass was disposed on a fluororesin jig so that two orthogonal sides of the glass were supported thereby, and was immersed for 20 hours in 330 mL of NaOH solution which had a temperature of 90° C. and a concentration of 0.1 N in a lidded vessel made of a fluororesin. The glass was taken out, and the surfaces thereof were rinsed with ion-exchanged water. The glass was subjected to 10-minute ultrasonic cleaning in ion-exchanged water and then left to dry on the jig. Thereafter, the glass was subjected to an appearance examination and weighed to determine the weight loss per unit area (unit: mg/cm$^2$) through the immersion. The haze (unit: %) thereof was further measured.

Figure 3:
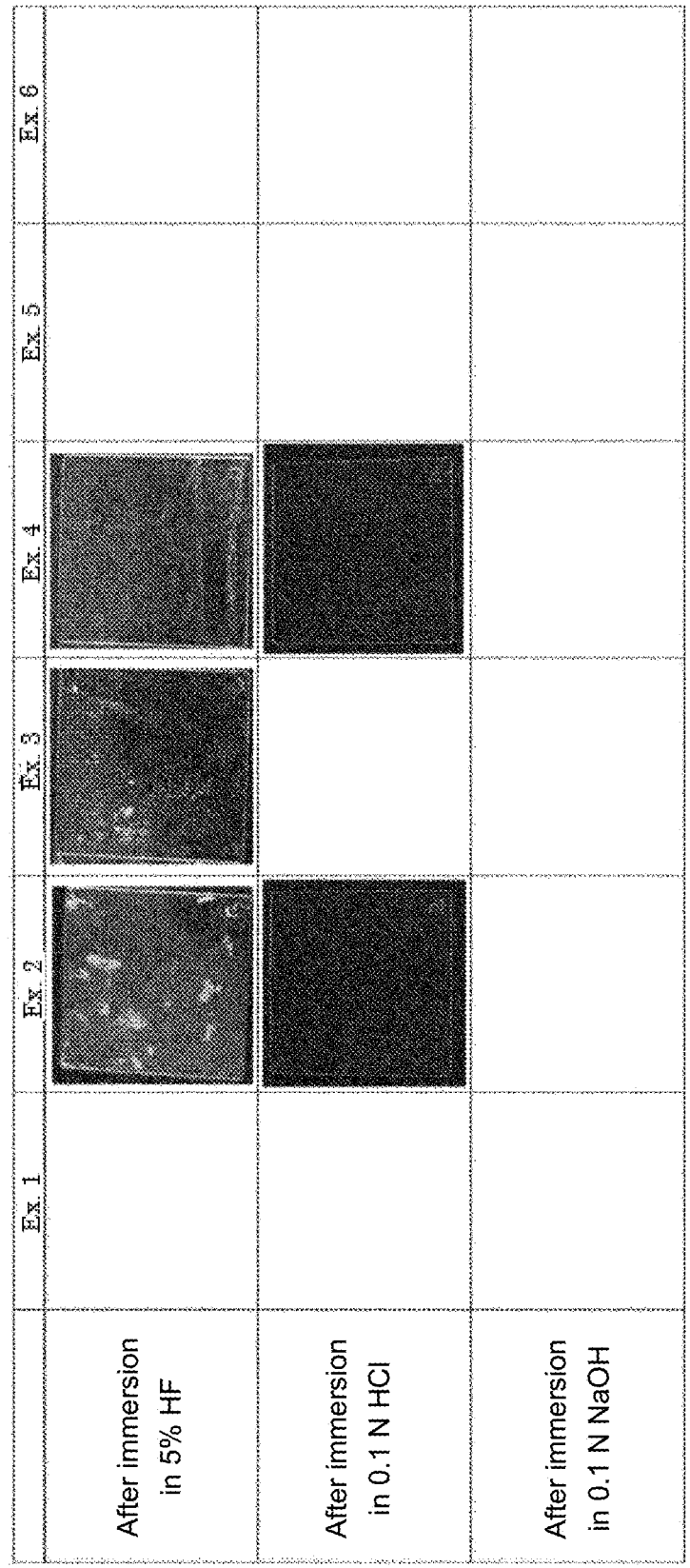
FIG. 3 is photographs of appearances of Example 1 to Example 6.
Figure 4:
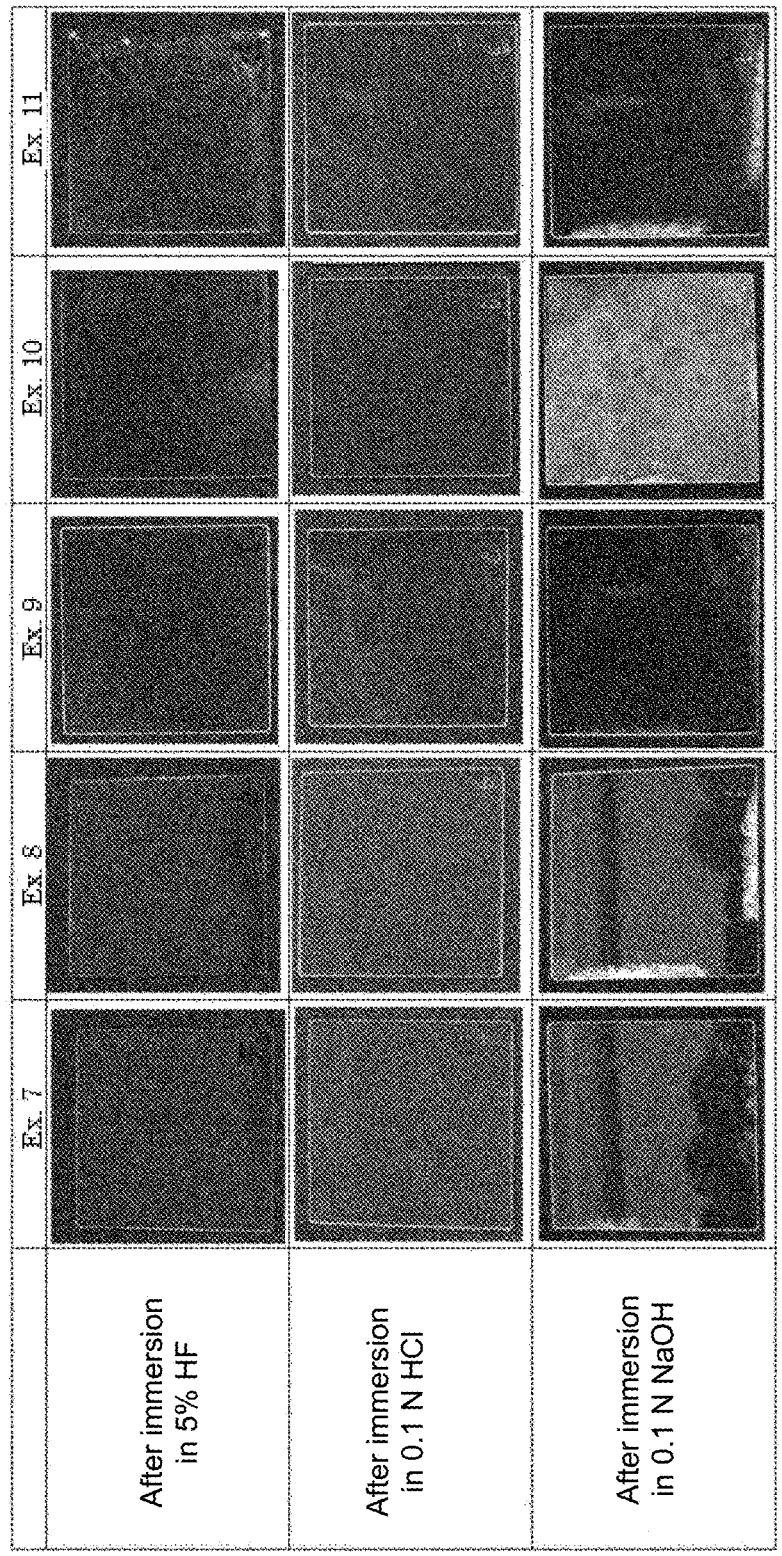
FIG. 4 is photographs of appearances of Example 7 to Example 11.

The appearance of each glass was visually examined, and was evaluated in accordance with the following evaluation criteria. Photographs of the glasses were taken and illustrated in FIGS. 3 and 4.

[Evaluation Criteria]

∘∘: The glass plate is wholly transparent.

∘: At least 90% of the whole glass plate is transparent.

Δ: Less than 90% of the whole glass plate is transparent or the surfaces of the glass plate have partly altered.

×: The glass plate has wholly opacified.

TABLE 1

| | | Ex. 1 | Ex. 2 | Ex. 3 | Ex. 4 | Ex. 5 | Ex. 6 |
|---|---|---|---|---|---|---|---|
| Composition (mol %) | SiO$_2$ | 65.0 | 61.5 | 65.8 | 62.0 | 67.3 | 66.9 |
| | Al$_2$O$_3$ | 6.0 | 5.0 | 6.0 | 5.0 | 6.0 | 6.0 |
| | B$_2$O$_3$ | 0.0 | 5.0 | 0.0 | 5.0 | 0.0 | 0.0 |
| | MgO | 0.0 | 0.0 | 0.0 | 0.0 | 0.0 | 0.0 |
| | CaO | 5.5 | 5.5 | 5.3 | 5.5 | 4.7 | 4.8 |
| | SrO | 9.0 | 9.0 | 9.0 | 9.0 | 9.0 | 9.0 |

TABLE 1-continued

|  |  |  |  |  |  |  |  |  |
|---|---|---|---|---|---|---|---|---|
|  | BaO |  | 14.5 | 14.0 | 14.0 | 13.5 | 13.0 | 13.3 |
|  | MgO + CaO + SrO + BaO |  | 29.0 | 28.5 | 28.3 | 28.0 | 26.7 | 27.1 |
|  | SiO₂₊Al₂O₃ |  | 71.0 | 66.5 | 71.8 | 67.0 | 73.3 | 72.9 |
| Value of expression (1) |  |  | 71.5 | 71.3 | 70.1 | 70.3 | 67.1 | 67.9 |
| Average coefficient of thermal expansion ($\times 10^{-7}$/° C.) |  |  | 71.6 | 71.3 | 70.6 | 70.7 | 67.8 | 68.4 |
| Density (g/cm³) |  |  | 3.23 | 3.22 | 3.20 | 3.20 | 3.15 | 3.17 |
| Young's modulus (GPa) |  |  | (74.5) | 79.2 | 76.6 | 79.0 | (74.3) | (74.3) |
| Strain point (° C.) |  |  | (671) | (622) | (673) | (624) | (678) | (677) |
| Glass transition temperature Tg (° C.) |  |  | (731) | 688 | (732) | (683) | 733 | 721 |
| T₄ (° C.) |  |  | 1159 | 1066 | 1165 | 1070 | 1191 | 1186 |
| T₂ (° C.) |  |  | 1478 | 1358 | 1489 | 1367 | 1536 | 1525 |
| Devitrification temperature T_L (° C.) |  |  | <1060 | <1045 | <1130 | <1050 | <1140 | <1140 |
| T₄ − T_L (° C.) |  |  | >99 | >21 | >35 | >20 | >51 | >46 |
| Chemical resistance | After immersion in 5% HF | Weight loss (mg/cm²) | 11.78 | 7.30 | 11.62 | 9.97 | 10.52 | 11.20 |
|  |  | Haze (%) |  | 29.6 |  | 42.6 |  |  |
|  |  | Appearance | Δ | Δ | Δ | Δ | ○ | ○ |
|  | After immersion in 0.1-N HCl | Weight loss (mg/cm²) | 0.03 | 0.16 | 0.03 | 0.14 | 0.02 | 0.02 |
|  |  | Haze (%) |  | 0.3 |  | 0.4 |  |  |
|  |  | Appearance | ○○ | ○○ | ○○ | ○○ | ○○ | ○○ |
|  | After immersion in 0.1-N NaOH | Weight loss (mg/cm²) |  |  |  |  |  |  |
|  |  | Haze (%) |  |  |  |  |  |  |
|  |  | Appearance |  |  |  |  |  |  |

|  |  |  | Ex. 7 | Ex. 8 | Ex. 9 | Ex. 10 | Ex. 11 |
|---|---|---|---|---|---|---|---|
| Composition (mol %) | SiO₂ |  | 72.0 | 69.0 | 65.0 | 66.0 | 63.0 |
|  | Al₂O₃ |  | 6.0 | 6.0 | 10.0 | 6.0 | 6.0 |
|  | B₂O₃ |  | 0.0 | 0.0 | 0.0 | 0.0 | 3.0 |
|  | MgO |  | 0.0 | 0.0 | 0.0 | 3.0 | 0.0 |
|  | CaO |  | 3.0 | 4.1 | 2.0 | 5.0 | 5.0 |
|  | SrO |  | 9.0 | 9.0 | 15.0 | 9.0 | 9.0 |
|  | BaO |  | 10.0 | 11.9 | 8.0 | 11.0 | 14.0 |
|  | MgO + CaO + SrO + BaO |  | 22.0 | 25.0 | 25.0 | 28.0 | 28.0 |
|  | SiO₂₊Al₂O₃ |  | 78.0 | 75.0 | 75.0 | 72.0 | 69.0 |
| Value of expression (1) |  |  | 58.3 | 63.9 | 62.9 | 65.9 | 70.1 |
| Average coefficient of thermal expansion ($\times 10^{-7}$/° C.) |  |  | 58.7 | 63.9 | 62.2 | 65.7 | 68.9 |
| Density (g/cm³) |  |  | 2.99 | 3.09 | 3.08 | 3.10 | 3.21 |
| Young's modulus (GPa) |  |  | (74.0) | (74.2) | (78.7) | (77.3) | (71.2) |
| Strain point (° C.) |  |  | (693) | (684) | (686) | (675) | (645) |
| Glass transition temperature Tg (° C.) |  |  | 747 | 738 | 763 | 731 | 700 |
| T₄ (° C.) |  |  | 1261 | 1215 | 1238 | 1187 | 1117 |
| T₂ (° C.) |  |  | 1651 | 1573 | 1592 | 1521 | 1433 |
| Devitrification temperature T_L (° C.) |  |  | 1220-1250 | <1170 |  | <1130 | 1070-1100 |
| T₄ − T_L (° C.) |  |  | 11-41 | >45 |  | >57 | >47 |
| Chemical resistance | After immersion in 5% HF | Weight loss (mg/cm²) | 5.38 | 8.78 | 10.57 | 10.44 | 12.06 |
|  |  | Haze (%) | 4.7 | 1.3 | 1.3 | 3.2 | 15.8 |
|  |  | Appearance | ○ | ○ | ○ | Δ | Δ |
|  | After immersion in 0.1-N HCl | Weight loss (mg/cm²) | 0.01 | 0.01 | 0.07 | 0.02 | 0.11 |
|  |  | Haze (%) | 0.5 | 0.4 | 0.3 | 0.3 | 0.8 |
|  |  | Appearance | ○○ | ○○ | ○○ | ○○ | ○○ |
|  | After immersion in 0.1-N NaOH | Weight loss (mg/cm²) | 2.19 | 2.03 | 2.74 | 1.72 | 2.10 |
|  |  | Haze (%) | 1.0 | 0.9 | 1.2 | 75.1 | 2.3 |
|  |  | Appearance | ○ | ○ | ○ | x | ○ |

TABLE 2

|  |  | Ex. 12 | Ex. 13 | Ex. 14 | Ex. 15 | Ex. 16 | Ex. 17 | Ex. 18 | Ex. 19 |
|---|---|---|---|---|---|---|---|---|---|
| Composition (mol %) | SiO₂ | 70.8 | 70.2 | 60.0 | 69.6 | 62.0 | 71.4 | 71.6 | 57.6 |
|  | Al₂O₃ | 6.0 | 6.0 | 5.0 | 6.0 | 5.0 | 6.0 | 6.0 | 2.0 |
|  | B₂O₃ | 0.0 | 0.0 | 0.0 | 0.0 | 0.0 | 0.0 | 0.0 | 0.0 |
|  | MgO | 0.0 | 0.0 | 5.7 | 0.0 | 1.7 | 0.0 | 0.0 | 0.0 |
|  | CaO | 3.4 | 3.7 | 5.0 | 3.9 | 5.0 | 3.2 | 3.2 | 19.9 |
|  | SrO | 9.0 | 9.0 | 9.7 | 9.0 | 11.7 | 9.0 | 9.0 | 8.6 |
|  | BaO | 10.8 | 11.1 | 14.6 | 11.5 | 14.6 | 10.4 | 10.3 | 12.0 |
|  | MgO + CaO + SrO + BaO | 23.2 | 23.8 | 35.0 | 24.4 | 33.0 | 22.6 | 22.5 | 40.5 |
|  | SiO₂₊Al₂O₃ | 76.8 | 76.2 | 65.0 | 75.6 | 67.0 | 77.4 | 77.6 | 59.5 |

TABLE 2-continued

|  |  |  | Ex. 12 | Ex. 13 | Ex. 14 | Ex. 15 | Ex. 16 | Ex. 17 | Ex. 18 | Ex. 19 |
|---|---|---|---|---|---|---|---|---|---|---|
| Value of expression (1) | | | 60.6 | 61.6 | 77.0 | 62.8 | 77.5 | 59.4 | 59.2 | 88.4 |
| Average coefficient of thermal expansion (×10$^{-7}$/° C.) | | | 61.0 | 62.0 | 77.4 | 63.0 | 77.9 | 60.0 | 59.0 | 87.7 |
| Density (g/cm$^3$) | | | 3.03 | 0.60 | 3.32 | 3.07 | 3.34 | 3.00 | 3.01 | 3.33 |
| Young's modulus (GPa) | | | 76 | 76 | 80 | 76 | 78 | 76 | 75 | (78.9) |
| Strain point (° C.) | | | (689) | (687) | (649) | (686) | (652) | (692) | (691) | (668) |
| Glass transition temperature Tg (° C.) | | | 741 | 739 | 721 | 738 | 725 | 744 | 745 | 717 |
| $T_4$ (° C.) | | | 1242 | 1234 | (1389) | 1227 | (1418) | 1250 | 1252 | 1289 |
| $T_2$ (° C.) | | | 1598 | 1587 | (1106) | 1576 | (1125) | 1610 | 1613 | 1058 |
| Devitrification temperature (° C.) | | | <1220 | <1220 |  | <1220 | <1070 | <1220 | <1220 | >1200 |
| $T_4 - T_L$ (° C.) | | | >42 | >14 |  | >7 | >55 | >30 | >32 |  |
| Chemical resistance | After immersion in 5% BF | Weight loss (mg/cm$^2$) | 6.74 | 7.42 | 9.90 | 8.10 | 11.20 | 5.38 | 5.59 | 7.12 |
|  |  | Haze (%) | 6.7 | 7.4 |  | 8.1 |  | 5.6 | 4.5 | 44.0 |
|  |  | Appearance | ○ | ○ |  | ○ |  | ○ | ○ | x |
|  | After immersion in 0.1-N HCl | Weight loss (mg/cm$^2$) | 0.01 | 0.01 | 0.12 | 0.01 | 0.08 | 0.01 | 0.01 | 0.89 |
|  |  | Haze (%) | 0.5 | 0.4 |  | 0.4 |  | 0.4 | 0.5 | 73.0 |
|  |  | Appearance | ○○ | ○○ | ○○ | ○○ | ○○ | ○○ | ○○ | x |
|  | After immersion in 0.1-N NaOH | Weight loss (mg/cm$^2$) |  |  |  |  |  |  |  | 0.82 |
|  |  | Haze (%) |  |  |  |  |  |  |  | 90.9 |
|  |  | Appearance |  |  |  |  |  |  |  | x |

Examples 1 to 18 are Examples according to the present invention, and Example 19 is a Comparative Example.

The glass substrates of Examples 1 to 18 according to the present invention each had a weight loss per unit area of 0.3 mg/cm$^2$ or less and a haze of 50% or less after 20-hour immersion in the HCl solution having a temperature of 90° C. and a concentration of 0.1 N, and had a weight loss per unit area of 13 mg/cm$^2$ or less and a haze of 50% or less after 20-minute immersion in the HF solution having a temperature of 25° C. and a concentration of 5%. The photographs of the appearances after the immersion in the HF solution and after the immersion in the HCl solution showed that none of these glass sheets had wholly opacified, which means high chemical resistance to the acidic solution.

The present invention is described in detail with reference to specific embodiments, but it is apparent for those skilled in the art that various changes or modifications can be added without departing from the spirit and the scope of the present invention. This application is based upon Japanese Patent Application (No. 2015-196548), filed on Oct. 2, 2015, the contents of which are incorporated herein by reference.

DESCRIPTION OF REFERENCE NUMERALS AND SIGNS

10, 40 Silicon substrate
20, 50 Release layer
30, 70 Laminated substrate
60 Resin
G1, G2 Glass substrate

The invention claimed is:

1. A glass substrate comprising, as a glass matrix composition as represented by mole percentage based on oxides,
   from 58% to 75% of $SiO_2$,
   from 4.5% to 7% of $Al_2O_3$,
   from 0% to 6% of MgO,
   from 0% to 6% of CaO,
   from 5% to 20% of SrO,
   from 9% to 20% of BaO, and
   from 15% to 40% of MgO+CaO+SrO+BaO,
   having an alkali metal oxide content of from 0% to 0.1% as represented by mole percentage based on oxides, and having an average coefficient of thermal expansion α of from 56×10$^{-7}$/° C. to 90×10$^{-7}$/° C. at a temperature of form 50° C. to 350° C.,
   wherein the glass matrix composition does not contain $B_2O_3$ and $CeO_2$, and
   wherein a thickness of the glass substrate is less than 2 mm.

2. The glass substrate according to claim 1, wherein a value determined by the following expression (1) that represents a relationship between rates of each of the oxides as represented by mole percentage based on oxides, is from 56 to 90:

$$0.174\times(\text{content of SiO}_2)-0.012\times(\text{content of Al}_2\text{O}_3)+0.317\times(\text{content of B}_2\text{O}_3)+0.988\times(\text{content of MgO})+1.715\times(\text{content of CaO})+2.011\times(\text{content of SrO})+2.251\times(\text{content of BaO})+0.076 \quad (1).$$

3. The glass substrate according to claim 1, comprising a total content of $SiO_2$ and $Al_2O_3$ of 65% or more as represented by mole percentage based on oxides.

4. The glass substrate according to claim 1, which has a weight loss per unit area of 0.3 mg/cm$^2$ or less, through 20-hour immersion in an HCl solution having a temperature of 90° C. and a concentration of 0.1 N.

5. The glass substrate according to claim 1, which has a weight loss per unit area of 13 mg/cm$^2$ or less, through 20-minute immersion in an HF solution having a temperature of 25° C. and a concentration of 5%.

6. The glass substrate according to claim 1, which has a haze of 50% or less with a thickness of 1 mm after 20-hour immersion in an HCl solution having a temperature of 90° C. and a concentration of 0.1 N.

7. The glass substrate according to claim 1, which has a haze of 50% or less after 20-minute immersion in an HF solution having a temperature of 25° C. and a concentration of 5%.

8. The glass substrate according to claim 1, which has a devitrification temperature of 1250° C. or lower.

9. The glass substrate according to claim 1, which has a content of $Fe_2O_3$ of 200 ppm or less as represented by mass parts per million based on oxides.

10. The glass substrate according to claim 1, which has a Young's modulus of 65 GPa or more.

11. The glass substrate according to claim 1, which has an area of from 70 to 2500 cm$^2$.

12. The glass substrate according to claim 1, which has a circular shape.

13. The glass substrate according to claim 1, which has a β-OH of from 0.05 to 0.65 mm$^{-1}$.

14. A laminated substrate comprising the glass substrate of claim 1 and a light-shielding film disposed on at least one main surface of the glass substrate.

15. A laminated substrate comprising the glass substrate of claim 1 and a silicon substrate laminated on the glass substrate.

16. A laminate comprising the laminated substrate of claim 15 and another glass substrate stuck to the glass substrate that is a component of the laminated substrate.

17. The glass substrate according to claim 1, wherein the thickness of the glass substrate is 1.5 mm or less.

\* \* \* \* \*